(12) United States Patent
Kobayashi

(10) Patent No.: US 6,532,057 B1
(45) Date of Patent: Mar. 11, 2003

(54) EXPOSURE APPARATUS AND METHOD

(75) Inventor: Shigeo Kobayashi, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 57 days.

(21) Appl. No.: 09/616,057

(22) Filed: Jul. 13, 2000

(30) Foreign Application Priority Data

Jul. 14, 1999 (JP) .......................... 11-199959

(51) Int. Cl.[7] ........................ G03B 27/42; G03B 27/58; G03B 27/62
(52) U.S. Cl. ............................. 355/53; 355/72; 355/75
(58) Field of Search ............................. 355/53, 55, 67, 355/30, 77, 72–76; 248/550; 250/548; 356/399–401

(56) References Cited

U.S. PATENT DOCUMENTS

| 4,956,999 A | * | 9/1990 | Bohannan et al. ............ 73/587 |
| 5,539,497 A | * | 7/1996 | Nishi ........................... 355/53 |
| 5,610,686 A | * | 3/1997 | Osanai ......................... 355/72 |
| 5,633,720 A | * | 5/1997 | Takahashi .................... 356/401 |
| 6,036,162 A | * | 3/2000 | Hayashi ....................... 248/550 |

* cited by examiner

Primary Examiner—Henry Hung Nguyen
(74) Attorney, Agent, or Firm—Fitzpatrick, Cella, Harper & Scinto

(57) ABSTRACT

An exposure apparatus for performing plural processes to transfer, by exposure, a pattern of a mask onto a photosensitive substrate. The apparatus includes a vibration detector for detecting vibration information related to the exposure apparatus, a memorizing unit for memorizing a vibration pattern of the exposure apparatus and a maintenance condition, in relation to each of the processes, and a discriminating device for discriminating whether maintenance is necessary on the basis of the detected vibration information while referring to the vibration pattern and the maintenance condition memorized in relation to each process.

9 Claims, 5 Drawing Sheets

| PROCESS | VIBRATION PATTERN | DISORDER CHECKING CONDITION |
|---|---|---|
| WAFER LOADING | P1 | C1 |
| ALIGNMENT | P2 | C2 |
| EXPOSURE | P3 | C3 |
| WAFER UNLOADING | P4 | C4 |
| RETICLE REPLACEMENT | P5 | C5 |
| ⋮ | ⋮ | ⋮ |

FIG. 5

EXPOSURE APPARATUS AND METHOD

FIELD OF THE INVENTION AND RELATED ART

This invention relates to an exposure apparatus and a method for lithographically transferring a mask having a pattern onto a photosensitive substrate through a projection optical system.

Conventional exposure apparatuses are generally arranged, for monitoring the state of operation of the apparatus, so that the state of sequence is continuously monitored by using software or hardware. For example, sequence members are assigned to processes beforehand and a corresponding sequence number is displayed on the exposure apparatus, whereby the state of operation of the apparatus is informed to an operator. Further, error numbers corresponding to disorders are assigned beforehand and, like the sequence numbers described above, an error number corresponding to a disorder that has occurred is displayed on the exposure apparatus, whereby the disorder is notified to the operator.

When plural exposure apparatuses are controlled through a network, generally, such a sequence number or an error number is notified from the exposure apparatus to a host computer. The host computer analyzes the received sequence number or error number and controls the state of operation of each apparatus.

In order to meet production of new devices or enhancement of precision, addition or modification of functions or units is made in exposure apparatuses. In such addition or modification of functions, it is necessary to incorporate additional sequence numbers or error numbers corresponding to added sequences or units for the function addition or modification. Also, in a network controlled system, the system itself has to be modified to meet the addition or modification of the function of each exposure apparatus.

Semiconductor devices are becoming smaller, and higher precision is required. Higher productivity is also required in order that new devices can be put on the market quickly. For these reasons, recently, the addition or modification of functions of an exposure apparatus is made frequently. This necessitates a complicated structure or system changing works in exposure apparatus manufacturers or semiconductor chip manufacturers, which burdens an increasing load to these manufacturers. On the other hand, in exposure apparatuses, periodic maintenance operations are made to keep the precision high. If an error occurs in a unit, the maintenance operation cannot be initiated until the error number analysis is completed. Thus, the operation of the exposure apparatus is discontinued in that period, and the productivity is, therefore, lowered.

SUMMARY OF THE INVENTION

It is an object of the present invention to provide an exposure apparatus, an exposure method and/or a device manufacturing method by which, on the basis of monitoring vibration information of the exposure apparatus, calculation of a maintenance time of the apparatus or detection of an error in the apparatus can be done easily and by which any addition or modification of a function in the apparatus can be met easily.

In accordance with an aspect of the present invention, there is provided an exposure apparatus for exposing a photosensitive substrate to a mask having a pattern through a projection optical system, comprising: means for detecting vibration information related to said apparatus; and means for analyzing the detected vibration information.

In accordance with another aspect of the present invention, there is provided an exposure apparatus for exposing a photosensitive substrate to a mask having a pattern through a projection optical system, comprising: means for detecting vibration information related to said apparatus; and means for storing the detected vibration information.

In accordance with a further aspect of the present invention, there is provided an exposure method to be used with an exposure apparatus as recited above, wherein the state of operation of the apparatus is controlled on the basis of the detected vibration information.

In accordance with a yet further aspect of the present invention, there is provided a device manufacturing method for producing a device by use of an exposure apparatus as recited above.

These and other objects, features and advantages of the present invention will become more apparent upon a consideration of the following description of the preferred embodiments of the present invention taken in conjunction with the accompanying drawings.

BRIEF DESCRIPTION OF THE DRAWINGS

FIG. 5 is a table for explaining vibration information and defect checking conditions in the apparatus of FIG. 1.

DESCRIPTION OF THE PREFERRED EMBODIMENTS

Preferred embodiments of the present invention will now be described with reference to the accompanying drawings.

Figure 1:
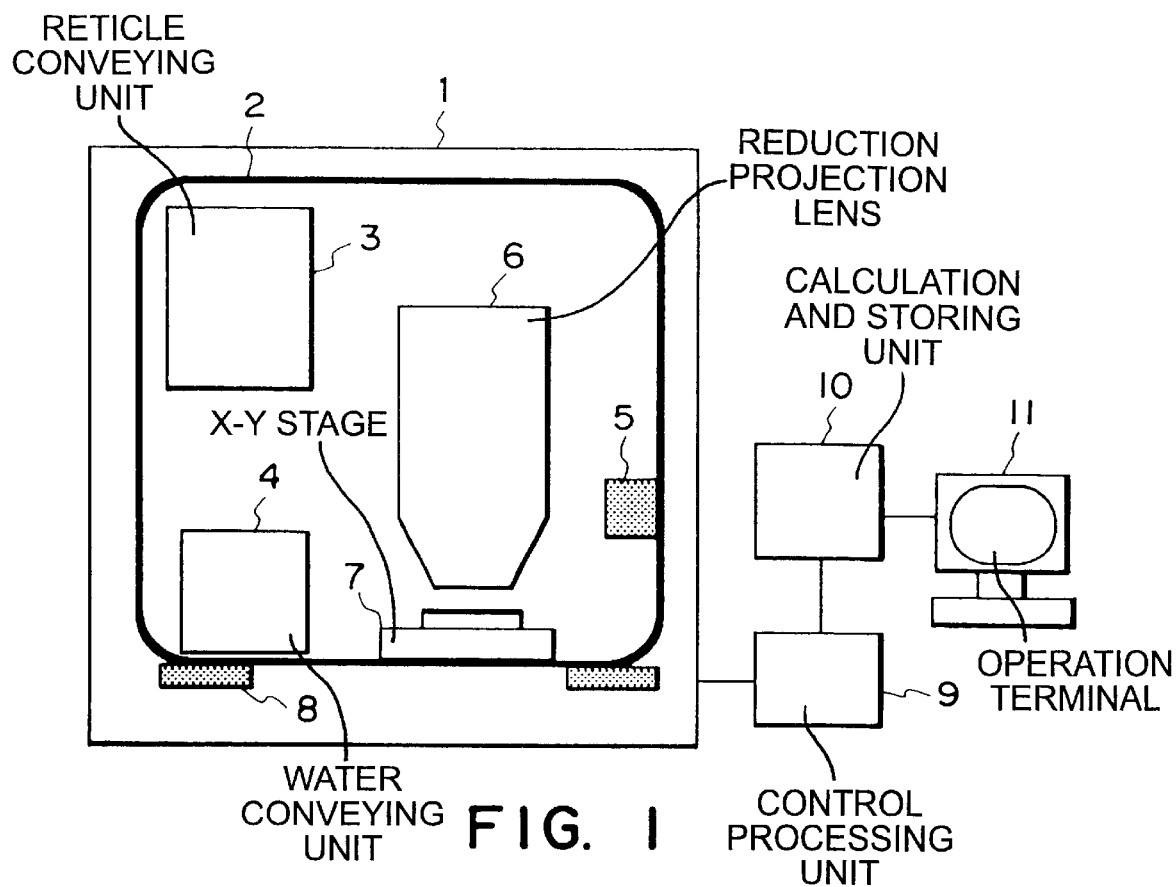
FIG. 1 is a schematic and block diagram view of a general structure of a semiconductor exposure apparatus according to an embodiment of the present invention.

First, the structure of a semiconductor exposure apparatus according to an embodiment of the present invention will be described. FIG. 1 is a schematic block diagram of a general structure of a semiconductor exposure apparatus according to one embodiment of the present invention. The semiconductor exposure apparatus includes a reticle conveying unit 3, a wafer conveying unit 4, a reduction projection lens 6, and an X-Y stage 7, all of these units being accommodated in a chamber 1. These units are mounted on and supported by a main base 2. The main base 2 is equipped with active dampers 8 by which an adverse influence of floor vibration can be reduced. A control processing unit 9 controls the operations of various units described above, during exposure processes in the semiconductor exposure apparatus. A calculation and storing unit 10 serves to control offset or process information in the semiconductor exposure apparatus. Through an operation terminal 11, an operator can manipulate the semiconductor exposure apparatus via the calculation and storing unit 10. Denoted at 5 in the drawing is a vibration measuring and processing unit. Vibration information related to the apparatus is measured by this unit, and it is memorized into the calculation and storing unit 10 through the control processing unit 9.

Figure 2:
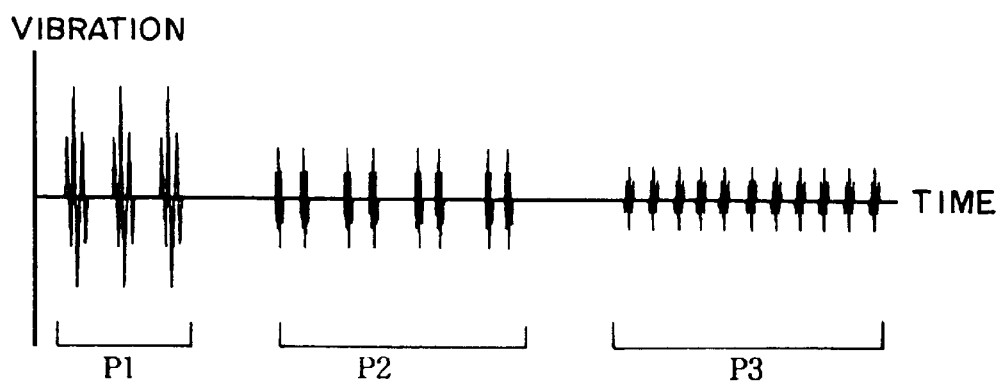
FIG. 2 is a graph for explaining vibration in the apparatus of FIG. 1.

Vibration information during an exposure process in the semiconductor exposure apparatus will now be described in detail. FIG. 2 is a graph showing an example of vibration of the apparatus, during an exposure process in the semiconductor exposure apparatus. In FIG. 2, the axis of the ordinate represents the amplitude of vibration, while the axis of the abscissa represents time. Denoted at P1, P2 and P3 in the drawing are typical patterns during the exposure process. The vibration pattern P1 relates to a wafer conveyance step. The vibration pattern P2 relates to an alignment step. The vibration pattern P3 relates to an exposure step. Each of these operation steps is characterized by the type of unit to be driven, the amount of drive thereof or a driving pattern thereof. Thus, vibration patterns have characteristic shapes corresponding to the steps, respectively. For example, if a fresh function is added, a vibration pattern being characteristic of the added function is produced.

Figures 3, 4:
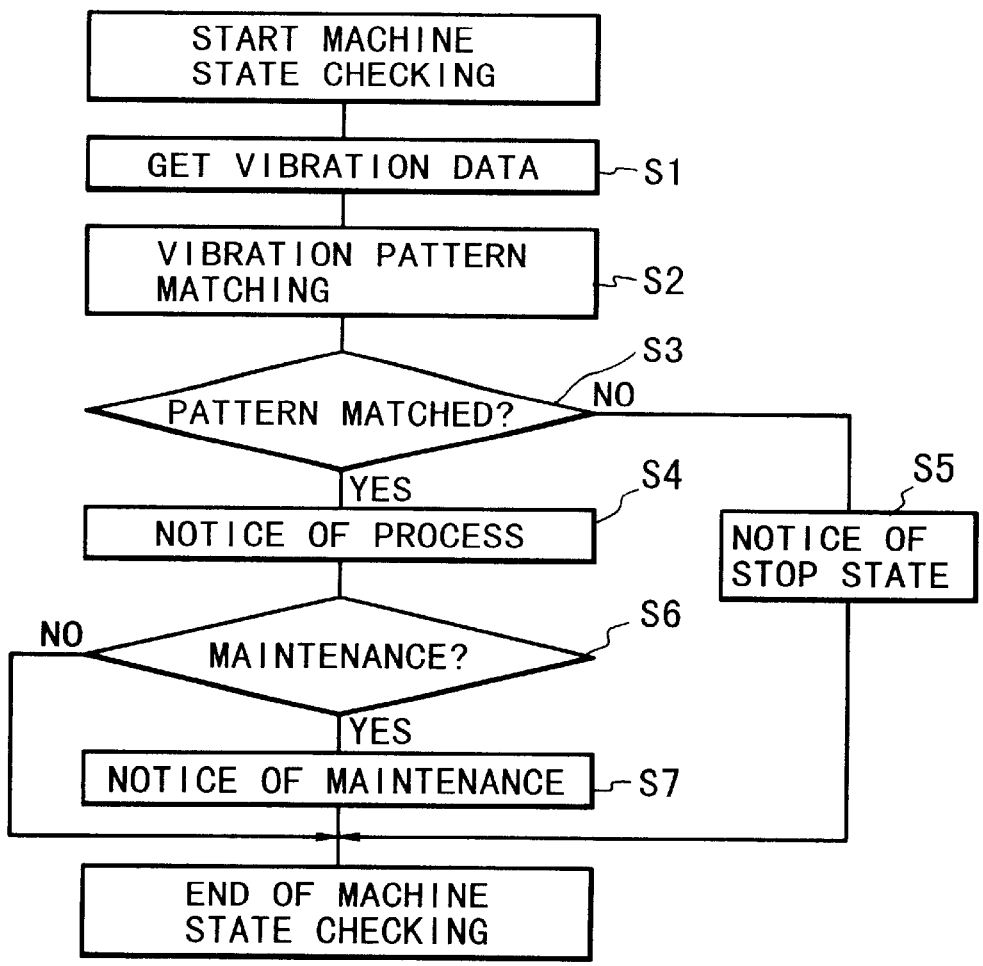
FIG. 3 is a table for explaining vibration information and maintenance conditions in the apparatus of a device according to the present invention.
FIG. 4 is a flow chart for checking the state of operation of the apparatus of FIG. 1.

FIG. 3 is a table for vibration information in the calculation and storing unit 10. In this table, a vibration pattern in the wafer loading step, for example, is denoted by P1, and a corresponding maintenance condition is denoted by M1. Here, P1 represents vibration pattern data being characteristic of the wafer loading step of FIG. 2, and M1 represents a maintenance condition such as a tolerance for the period or the amplitude of vibration, for example.

Referring to the flow chart of FIG. 4, an example of a monitoring sequence for the state of operation based on the vibration information (FIGS. 2 and 3) will be described. First, at step S1, vibration data is detected or obtained. Then, at step S2, the detected vibration pattern is collated with the vibration table shown in FIG. 3. Subsequently, at step S3, if the pattern is not matched with any pattern in the table, the sequence goes to step S5 whereby the stopped state of the apparatus is notified to the operator or the host computer. The operation state checking is thus completed. On the other hand, at step S3 the pattern is matched with any pattern in the table and the sequence goes to step S4.

At step S4, the matching at the step S3 is notified. Then, at step S6, in relation to the detected vibration pattern, the maintenance condition in the vibration information table of FIG. 3 is checked. If at step S6 the maintenance operation is discriminated as being necessary, the maintenance operation is notified at step S7. The operation state checking procedure is thus completed. If at step S6 the maintenance operation is discriminated as being unnecessary, the operation state checking procedure is directly discontinued. In the checking process at step S6, the state of operation of the apparatus is ranked in accordance with the state of vibration, and an appropriate maintenance time (timing) can be notified.

What is described above is an example wherein the detected vibration information is applied to the maintenance operation. However, the vibration information during an exposure process may be stored or accumulated and it may be used as a reference for any defect inspection at a later stage. FIG. 5 shows a vibration information table for such defect checking to be done after completion of an exposure process. Denoted at C1–C5 in FIG. 5 are discrimination criteria (references) for defect checking. In the defect checking process to be done after completion of an exposure process, any defect product may be checked beforehand in accordance with the vibration information table of FIG. 5. This enables sufficient defective product inspection.

Next, an embodiment of a semiconductor device manufacturing method which uses an exposure apparatus or exposure method described above, will be explained.

Figure 6:
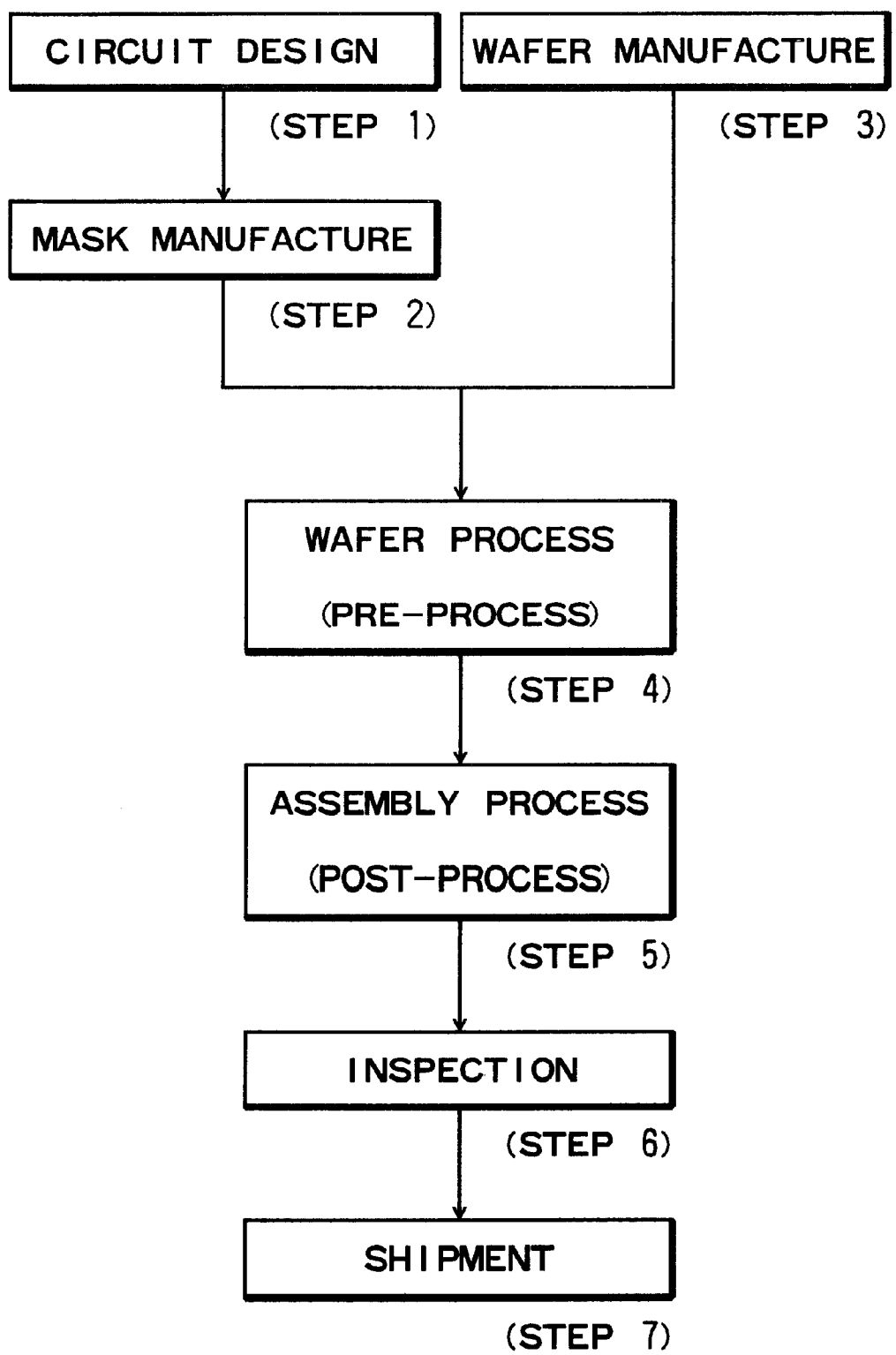
FIG. 6 is a flow chart of microdevice manufacturing processes.

FIG. 6 is a flow chart of a procedure for the manufacture of microdevices such as semiconductor chips (e.g., ICs or LSIs), liquid crystal panels, CCDs, thin film magnetic heads or micro-machines, for example.

Step 1 is a design process for designing a circuit of a semiconductor device. Step 2 is a process for making a mask on the basis of the circuit pattern design. Step 3 is a process for preparing a wafer by using a material such as silicon. Step 4 is a wafer process (called a pre-process) wherein, by using the so prepared mask and wafer, circuits are practically formed on the wafer through lithography. Step 5 subsequent to this is an assembling step (called a post-process) wherein the wafer having been processed by step 4, is formed into semiconductor chips. This step includes an assembling (dicing and bonding) process and a packaging (chip sealing) process. Step 6 is an inspection step wherein an operation check, a durability check and so on for the semiconductor devices provided by step 5, are carried out. With these processes, semiconductor devices are completed and they are shipped (step 7).

Figure 7:
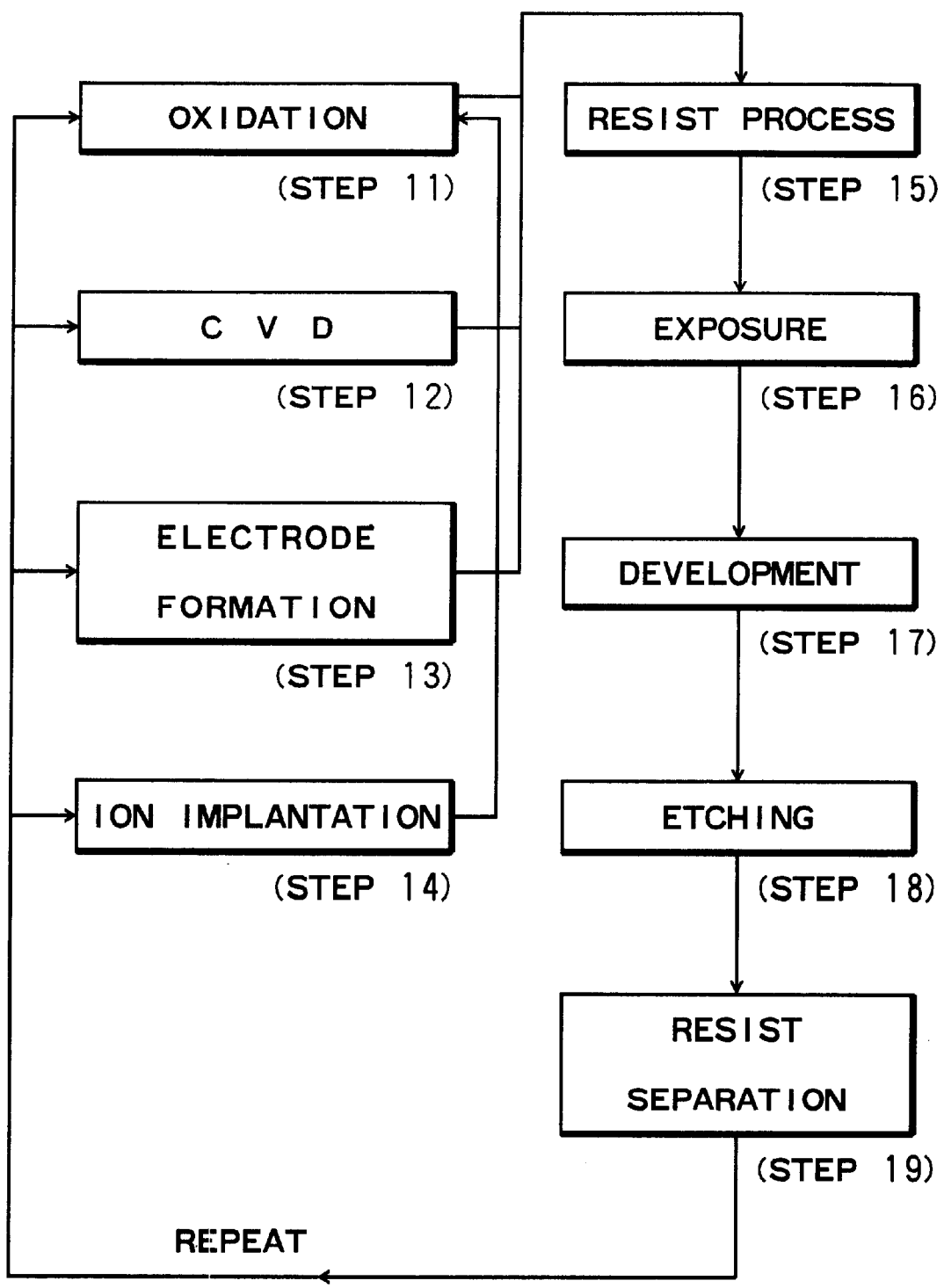
FIG. 7 is a flow chart for explaining details of a wafer process included in the procedure of FIG. 6.

FIG. 7 is a flow chart showing details of the wafer process.

Step 11 is an oxidation process for oxidizing the surface of a wafer. Step 12 is a CVD process for forming an insulating film on the wafer surface. Step 13 is an electrode forming process for forming electrodes upon the wafer by vapor deposition. Step 14 is an ion implanting process for implanting ions to the wafer. Step 15 is a resist process for applying a resist (photosensitive material) to the wafer. Step 16 is an exposure process for printing, by exposure, the circuit pattern of the mask on the wafer through the exposure apparatus described above. Step 17 is a developing process for developing the exposed wafer. Step 18 is an etching process for removing portions other than the developed resist image. Step 19 is a resist separation process for separating the resist material remaining on the wafer after being subjected to the etching process. By repeating these processes, circuit patterns are superposedly formed on the wafer.

With these processes, high density microdevices can be manufactured.

In accordance with an exposure apparatus of the present invention, any modification in process or unit required by the addition or modification of the function of the exposure apparatus can be met simply by adding a pattern of vibration information. There is no restriction by sequence numbers, for example. Therefore, even when plural exposure apparatuses are controlled through a network, only a small modification to a host computer of the network control system can restructure a control system corresponding to an added process. Further, on the basis of vibration information, an appropriate maintenance time (timing) and/or an efficient defect product checking system can be provided.

While the invention has been described with reference to the structures disclosed herein, it is not confined to the details set forth and this application is intended to cover such modifications or changes as may come within the purposes of the improvements or the scope of the following claims.

What is claimed is:

1. An exposure apparatus for performing plural processes to transfer, by exposure, a pattern of a mask onto a photosensitive substrate, said apparatus comprising:

vibration detecting means for detecting vibration information related to said exposure apparatus;

memorizing means for memorizing a vibration pattern of said exposure apparatus and a maintenance condition, in relation to each of the processes; and discriminating means for discriminating whether maintenance is necessary on the basis of the detected vibration information while referring to the vibration pattern and the maintenance condition memorized in relation to each process.

2. An apparatus according to claim 1, further comprising means for informing a maintenance time.

3. An apparatus according to claim 1, wherein said plural processes include at least one of a photosensitive substrate conveying process, an alignment process, and an exposure process.

4. A device manufacturing method for manufacturing a device by use of an exposure apparatus as recited in claim 1.

5. An exposure apparatus for performing plural processes to transfer, by exposure, a pattern of a mask onto a photosensitive substrate, said apparatus comprising:

vibration detecting means for detecting vibration information related to said exposure apparatus;

memorizing means for memorizing a vibration pattern of said exposure apparatus and a defect checking condition, in relation to each of the processes; and discriminating means for discriminating whether defect checking of the photosensitive substrate after being exposed is necessary, on the basis of the detected vibration information while referring to the vibration pattern and the defect checking condition memorized in relation to each process.

6. An apparatus according to claim 5, wherein said plural processes include at least one of a photosensitive substrate conveying process, an alignment process, and an exposure process.

7. A device manufacturing method for manufacturing a device by use of an exposure apparatus as recited in claim 5.

8. An exposure method for performing plural processes to transfer, by exposure and with use of an exposure apparatus, a pattern of a mask onto a photosensitive substrate, said method comprising the steps of:

detecting vibration information related to the exposure apparatus;

memorizing a vibration pattern of the exposure apparatus and a maintenance condition, in relation to each of the processes; and discriminating whether maintenance is necessary, on the basis of the detected vibration information while referring to the vibration pattern and the maintenance condition memorized in relation to each process.

9. An exposure method for performing plural processes to transfer, by exposure and with use of an exposure apparatus, a pattern of a mask onto a photosensitive substrate, said method comprising the steps of:

detecting vibration information related to the exposure apparatus;

memorizing a vibration pattern of the exposure apparatus and a defect checking condition, in relation to each of the processes; and discriminating whether defect checking of the photosensitive substrate after being exposed is necessary, on the basis of the detected vibration information while referring to the vibration pattern and the defect checking condition memorized in relation to each process.

* * * * *